(12) United States Patent
Lin et al.

(10) Patent No.: US 12,451,403 B2
(45) Date of Patent: Oct. 21, 2025

(54) POWER MODULE AND MANUFACTURING METHOD THEREOF

(71) Applicant: Industrial Technology Research Institute, Hsinchu (TW)

(72) Inventors: Hsin-Han Lin, Hsinchu County (TW); Tai-Jyun Yu, Taoyuan (TW)

(73) Assignee: Industrial Technology Research Institute, Hsinchu (TW)

( * ) Notice: Subject to any disclaimer, the term of this patent is extended or adjusted under 35 U.S.C. 154(b) by 519 days.

(21) Appl. No.: 17/732,428

(22) Filed: Apr. 28, 2022

(65) Prior Publication Data

US 2023/0352361 A1    Nov. 2, 2023

(51) Int. Cl.
*H01L 23/373* (2006.01)
*H01L 21/48* (2006.01)
(Continued)

(52) U.S. Cl.
CPC ...... *H01L 23/3735* (2013.01); *H01L 21/4857* (2013.01); *H01L 23/5383* (2013.01);
(Continued)

(58) Field of Classification Search
CPC ............ H01L 23/3735; H01L 21/4857; H01L 23/49811; H01L 24/29–48;
(Continued)

(56) References Cited

U.S. PATENT DOCUMENTS

| | | |
|---|---|---|
| 7,423,332 B2 | 9/2008 | Gerbsch et al. |
| 9,147,666 B2 | 9/2015 | Yoshihara et al. |

(Continued)

FOREIGN PATENT DOCUMENTS

| | | |
|---|---|---|
| CN | 113053839 | 6/2021 |
| TW | 201916279 | 4/2019 |

(Continued)

OTHER PUBLICATIONS

Amol Deshpande et al., "Stacked DBC Cavitied Substrate for a 15-kV Half-bridge Power Module", 2019 IEEE International Workshop on Integrated Power Packaging (IWIPP), Apr. 24-26, 2019, pp. 1-6.

(Continued)

*Primary Examiner* — Joshua Benitez Rosario
*Assistant Examiner* — Moataz Khalifa
(74) *Attorney, Agent, or Firm* — JCIPRNET

(57) ABSTRACT

Provided are a power module and a manufacturing method thereof. The power module includes an insulating substrate, a first, a second and a third conductive layers, a first thermal interface material layer, a first and a second chips and a thermal conductive layer. The insulating substrate has a first and a second surfaces opposite to each other. The first and the second conductive layers are disposed on the first surface, and electrically separated from each other. The first thermal interface material layer is disposed on the first conductive layer. The third conductive layer is disposed on the first thermal interface material layer. The first chip is disposed on the third conductive layer and electrically connected to the third conductive layer. The second chip is disposed on the second conductive layer and electrically connected to the second conductive layer. The thermal conductive layer is disposed on the second surface.

20 Claims, 7 Drawing Sheets

(51) Int. Cl.
*H01L 23/00* (2006.01)
*H01L 23/498* (2006.01)
*H01L 23/538* (2006.01)
*H01L 25/07* (2006.01)

(52) U.S. Cl.
CPC ......... *H01L 23/49811* (2013.01); *H01L 24/29* (2013.01); *H01L 24/32* (2013.01); *H01L 24/48* (2013.01); *H01L 24/73* (2013.01); *H01L 24/92* (2013.01); *H01L 25/072* (2013.01); *H01L 2224/29139* (2013.01); *H01L 2224/29147* (2013.01); *H01L 2224/32225* (2013.01); *H01L 2224/48105* (2013.01); *H01L 2224/48225* (2013.01); *H01L 2224/73265* (2013.01); *H01L 2224/92247* (2013.01); *H01L 2924/1517* (2013.01)

(58) Field of Classification Search
CPC . H01L 2224/48105; H01L 2224/73265; H01L 25/072
See application file for complete search history.

(56) References Cited

U.S. PATENT DOCUMENTS

| | | | |
|---|---|---|---|
| 9,391,055 | B2 | 7/2016 | Romas, Jr. et al. |
| 10,283,454 | B2* | 5/2019 | Traub ................... H01L 23/5385 |
| 2011/0140263 | A1* | 6/2011 | Camacho ............ H01L 23/5389 |
| | | | 257/E23.141 |
| 2017/0084521 | A1* | 3/2017 | Chang ................. H01L 23/3114 |
| 2021/0100128 | A1* | 4/2021 | Lyu ...................... H05K 3/0061 |

FOREIGN PATENT DOCUMENTS

| | | |
|---|---|---|
| TW | I660471 | 5/2019 |
| TW | 202105535 | 2/2021 |
| TW | 202141718 | 11/2021 |
| TW | 202215605 | 4/2022 |

OTHER PUBLICATIONS

"Office Action of Taiwan Counterpart Application", issued on Feb. 20, 2023, p. 1-p. 7.

* cited by examiner

POWER MODULE AND MANUFACTURING METHOD THEREOF

TECHNICAL FIELD

The present disclosure relates to a power module and a manufacturing method thereof.

BACKGROUND

Generally, in order to improve the power density of a power device and meet the need of low cost, semiconductor devices are combined in a package structure to form a power module, thereby providing high output power in a small package structure.

In addition, as the power increases, the current and the voltage increase, and the need to connect chips in parallel increases. As a result, the current path becomes longer, which not only greatly increases the layout area of the device, but also leads to an increase in parasitic inductance. The performance of the device is therefore affected.

SUMMARY

A power module of the present disclosure includes an insulating substrate, a first conductive layer, a second conductive layer, a third conductive layer, a first thermal interface material layer, a first chip, a second chip and a thermal conductive layer. The insulating substrate has a first surface and a second surface opposite to each other. The first conductive layer and the second conductive layer are disposed on the first surface and electrically separated from each other. The first thermal interface material layer is disposed on the first conductive layer. The third conductive layer is disposed on the first thermal interface material layer. The first chip is disposed on the third conductive layer and electrically connected to the third conductive layer. The second chip is disposed on the second conductive layer and electrically connected to the second conductive layer. The thermal conductive layer is disposed on the second surface.

A manufacturing method of a power module of the present disclosure includes the following steps. An insulating substrate with a first surface and a second surface opposite to each other is provided. A first conductive layer and a second conductive layer are formed on the first surface, wherein the first conductive layer and the second conductive layer are electrically separated from each other. A thermal conductive layer is formed on the second surface. A first thermal interface material layer and a third conductive layer are formed in sequence on the first conductive layer. A first chip is formed on the third conductive layer, wherein the first chip is electrically connected to the third conductive layer. A second chip is formed on the second conductive layer, wherein the second chip is electrically connected to the second conductive layer.

DESCRIPTION OF THE EMBODIMENTS

Figure 1A:
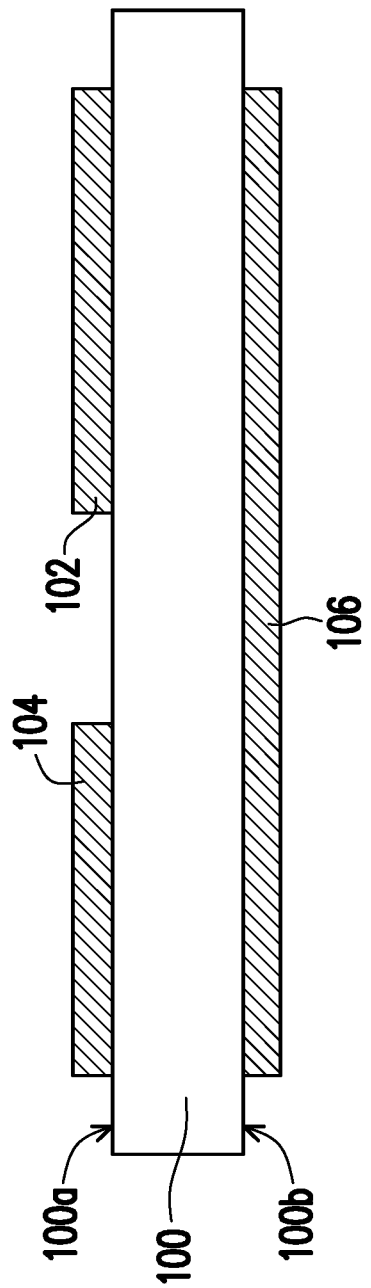
FIGS. 1A to 1C are schematic cross-sectional views of a manufacturing process of a power module according to a first embodiment of the present disclosure.

The embodiments are described in detail below with reference to the accompanying drawings, but the embodiments are not intended to limit the scope of the present disclosure. In addition, the drawings are for illustrative purposes only and are not drawn to the original dimensions. For the purpose of easy understanding, the same elements in the following description will be denoted by the same reference numerals.

The terms mentioned in the text, such as "comprising", "including" and "having" are all open-ended terms, i.e., meaning "comprising but not limited to".

When using terms such as "first" and "second" to describe a device, it is only used to distinguish these devices from each other, and does not limit the order or importance of these devices. Therefore, in some cases, the first device can also be called the second device, and the second device can also be called the first device, and this does not deviate from the scope of the present disclosure.

In addition, in the text, the range represented by "a value to another value" is a summary expression way to avoid listing all the values in the range one by one in the specification. Therefore, the record of a specific numerical range covers any numerical value within the numerical range, as well as a smaller numerical range defined by any numerical value within the numerical range.

Figure 1B:
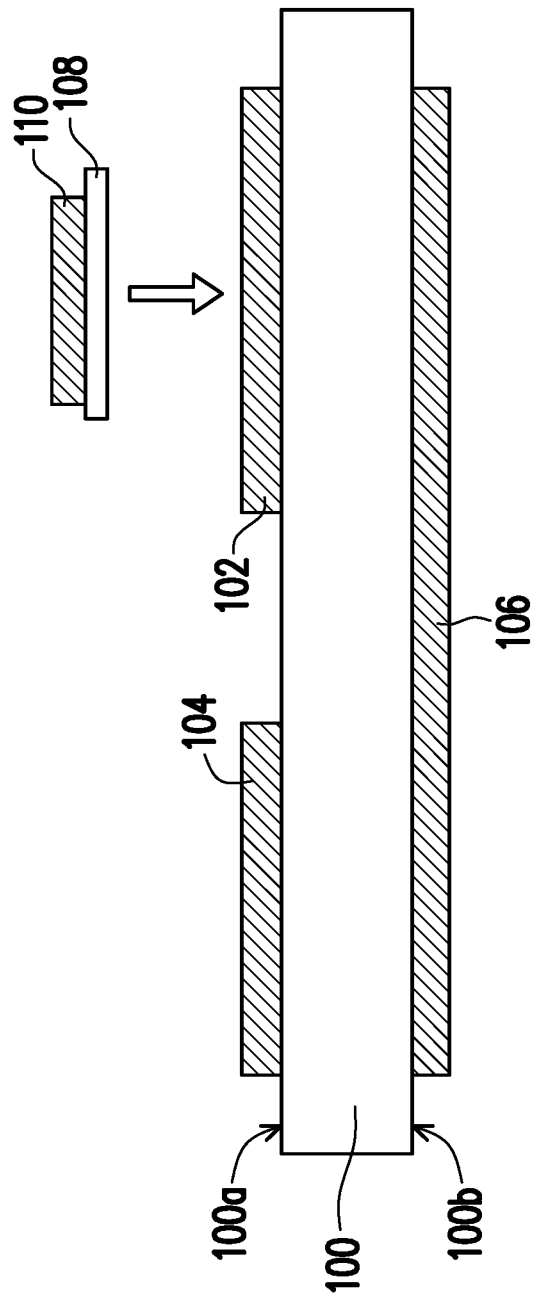
Figure 1C:
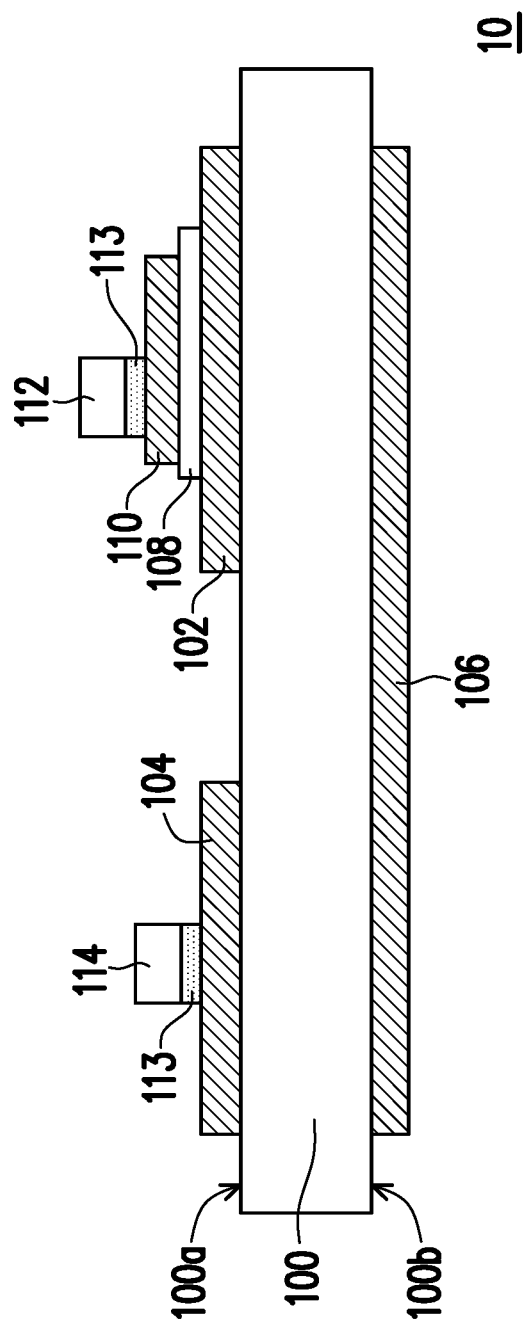

FIGS. 1A to 1C are schematic cross-sectional views of a manufacturing process of a power module according to a first embodiment of the present disclosure. Referring to FIG. 1A, an insulating substrate 100 is provided. The insulating substrate 100 has a first surface 100a and a second surface 100b opposite to each other. In the present embodiment, the insulating substrate 100 is a ceramic substrate. The insulating substrate 100 may be used to carry a chip and conduct the heat generated during the operation of the chip. Then, a first conductive layer 102 and a second conductive layer 104 that are electrically separated from each other are formed on the first surface 100a of the insulating substrate 100, and a thermal conductive layer 106 is formed on the second surface 100b of the insulating substrate 100. The first conductive layer 102 and the second conductive layer 104 serve as circuit patterns on the insulating substrate 100. In the present embodiment, the first conductive layer 102 and the second conductive layer 104 may be metal layers, such as copper layers, but the embodiment of the present disclosure is not limited thereto. In the present embodiment, the thermal conductive layer 106 may be a metal layer, such as a copper layer, but the embodiment of the present disclosure is not limited thereto. In some embodiments, in addition to heat conduction, the thermal conductive layer 106 may also be used as an electrode layer according to practical requirements.

In the present embodiment, the thickness of the insulating substrate 100 is, for example, between 0.385 mm and 0.635 mm, and the insulating substrate 100, the first conductive layer 102, the second conductive layer 104 and the thermal conductive layer 106 constitute a direct bonded cooper (DBC) ceramic substrate. In other embodiments, the DBC ceramic substrate may also be replaced by a direct plated copper (DPC) ceramic substrate.

Next, referring to FIG. 1B, a third conductive layer 110 is laminated on a first thermal interface material layer 108. In the present embodiment, the material of the first thermal interface material layer 108 may be silicon, silicon oxide, aluminum oxide, aluminum nitride, boron nitride or a combination thereof. The thickness of the first thermal interface material layer 108 is, for example, between 100 µm and 150 µm. The thermal conductivity of the first thermal interface material layer 108 is, for example, between 3 W/mK and 15 W/mK, or even higher. In addition, in the present embodiment, the third conductive layer 110 may be a metal layer, such as a copper layer, but the embodiment of the present disclosure is not limited thereto. In the present embodiment, the lamination temperature for laminating the third conductive layer 110 to the first thermal interface material layer 108 does not exceed 120° C. The first thermal interface material layer 108 and the third conductive layer 110 constitute an insulating metal substrate (IMS). In addition, unlike the general insulating metal substrate, in the present embodiment, only one surface of the first thermal interface material layer 108 is laminated with a conductive layer, so the thickness of the insulating metal substrate of the present embodiment may be thinner.

Then, the insulating metal substrate of the present embodiment is laminated to the insulating substrate 100. In detail, in the present embodiment, the first thermal interface material layer 108 is laminated onto the first conductive layer 102 in a manner that the first thermal interface material layer 108 faces the first surface 100a of the insulating substrate 100. In the present embodiment, the lamination temperature for laminating the first thermal interface material layer 108 to the first conductive layer 102 does not exceed 160° C.

Then, referring to FIG. 1C, a first chip 112 is formed on the third conductive layer 110 and a second chip 114 is formed on the second conductive layer 104 to form a power module 10 of the present embodiment. In detail, after laminating the insulating metal substrate composed of the first thermal interface material layer 108 and the third conductive layer 110 of the present embodiment to the insulating substrate 100, a conductive adhesion layer 113 is formed on the second conductive layer 104 and the third conductive layer 110. Then, the first chip 112 is fixed on the conductive adhesion layer 113 located on the third conductive layer 110 so that the first chip 112 is electrically connected to the third conductive layer 110 through the conductive adhesion layer 113, and the second chip 114 is fixed on the conductive adhesion layer 113 located on the second conductive layer 104 so that the second chip 114 is electrically connected to the second conductive layer 104 through the conductive adhesion layer 113. In the present embodiment, the conductive adhesion layer 113 is, for example, a solder layer. In addition, in other embodiments, the conductive adhesion layer 113 may also be a bonding layer formed by sintering silver or copper.

In the power module 10, the first thermal interface material layer 108 and the third conductive layer 110 constitute an insulating metal substrate, and the insulating metal substrate is disposed on the DBC ceramic substrate composed of the insulating substrate 100, the first conductive layer 102, the second conductive layer 104 and the thermal conductive layer 106. Since the insulating metal substrate has only one conductive layer, i.e., the third conductive layer 110, the overall thickness of the power module 10 may be effectively reduced. Furthermore, since the overall thickness of the power module 10 is reduced, under high power density, the thermal resistance difference between the first chip 112 and the second chip 114 may be effectively reduced, and the thermal capacity difference between the first chip 112 and the second chip 114 may also be reduced. In addition, since the overall thickness of the power module 10 is reduced, the mutual inductance in the power module 10 may be more significant. In addition, in the power module 10 of the present embodiment, since the insulating metal substrate is disposed on the DBC ceramic substrate, the problem of excessive warpage caused by stress relief when stacking ceramic substrates is avoided.

In addition, in the manufacturing process of the power module 10, before the chips (the first chip 112 and the second chip 114) are disposed, the insulating metal substrate is laminated to the DBC ceramic substrate, so that the chips may be prevented from being subjected to multiple reflow processes, and thus the reduction of the reliability of the chips may be effectively avoided.

In addition, in the power module 10, the heat generated by the first chip 112 during operation may be transferred to the external of the power module 10 through the conductive adhesion layer 113, the third conductive layer 110, the first thermal interface material layer 108, the first layer 102, the insulating substrate 100 and the thermal conductive layer 106. The heat generated by the second chip 114 during operation of may be transferred to the external of the power module 10 through the conductive adhesion layer 113, the second conductive layer 104, the insulating substrate 100 and the thermal conductive layer 106.

In the present embodiment, the insulating metal substrate is laminated onto the DBC ceramic substrate. That is, the ceramic substrate is used as the insulating substrate 100, but the embodiment of the present disclosure is not limited thereto. In other embodiments, the insulating substrate 100 may also be a thermal interface material substrate to further reduce the overall thickness of the power module. In the embodiment where the insulating substrate 100 is a thermal interface material substrate, the material of the insulating substrate 100 may be silicon, silicon oxide, aluminum oxide, aluminum nitride, boron nitride or a combination thereof, the thickness of the insulating substrate 100 is, for example, between 100 µm and 150 µm, and the thermal conductivity of the insulating substrate 100 is, for example, between 3 W/mK and 15 W/mK, or even higher.

Depending on the application, the power module of the present embodiment may also include other components, which will be explained below.

Figure 2:
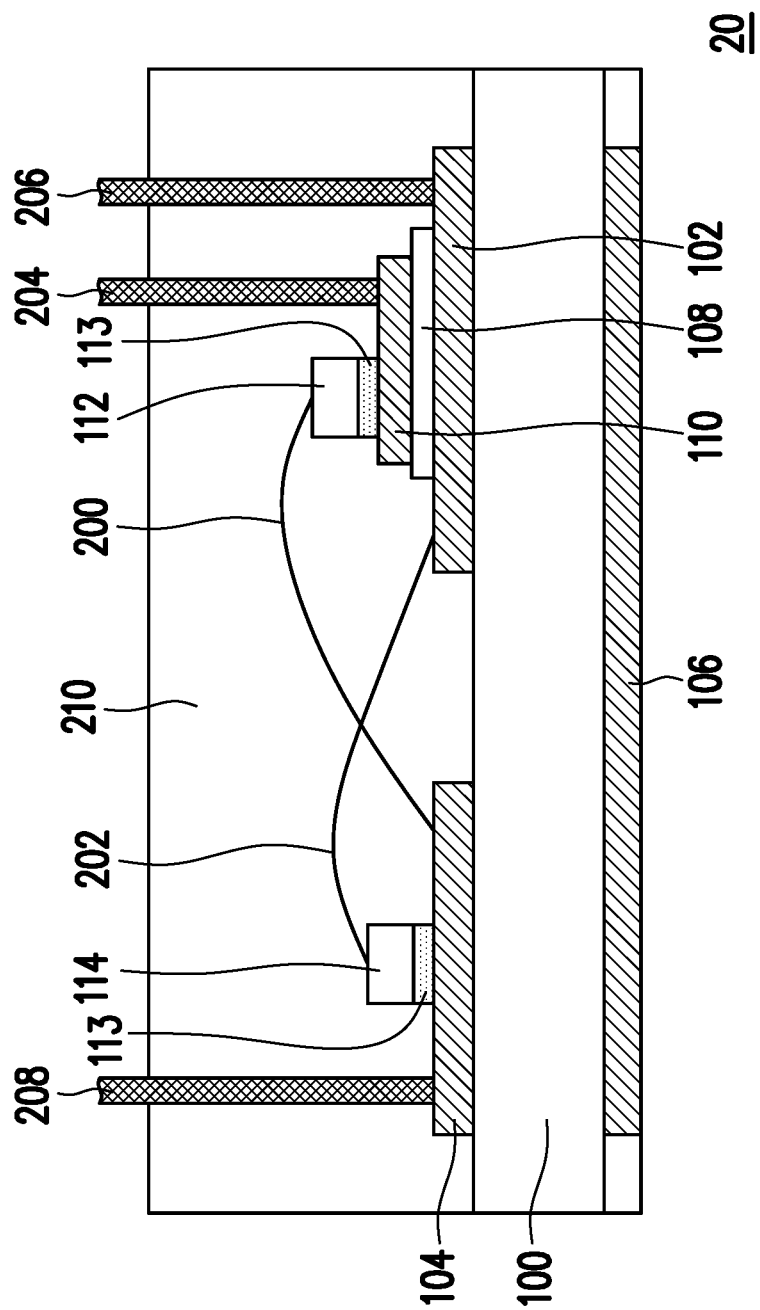
FIG. 2 is a schematic cross-sectional view of a power module according to a second embodiment of the present disclosure.

FIG. 2 is a schematic cross-sectional view of a power module according to a second embodiment of the present disclosure. In the present embodiment, the same device as the first embodiment will be represented by the same reference number, and will not be further described here. Referring to FIG. 2, in the power module 20, the first chip 112 may be electrically connected to the second conductive layer 104 through a first bonding wire 200, and the second chip 114 may be electrically connected to the first conductive layer 102 through a second bonding wire 202. In addition, a first terminal 204 is connected to the third conductive layer 110, a second terminal 206 is connected to the first conductive layer 102, and a third terminal 208 is connected to the second conductive layer 104. The first terminal 204, the second terminal 206 and the third terminal 208 may be connected to the external apparatus, respectively. An encapsulant 210 may encapsulate the insulating substrate 100, the first conductive layer 102, the second conductive layer 104, a part of the thermal conductive layer 106, the first thermal interface material layer 108, the third conductive layer 110, the first chip 112, the conductive adhesion layer 113, the second chip 114, the first bonding wire 200, the second bonding wire 202, a part of the first terminal 204, a part of the second terminal 206 and a part of the third terminal 208, but the embodiment of the present disclosure is not limited thereto. At the bottom of the power module 20, the surface of the thermal conductive layer 106 is exposed by the encapsulant 210, so as to transfer the heat generated by the first chip 112 and the second chip 114 during operation to the external of the power module 20.

During the operation of the power module 20, the current may flow from the first terminal 204 to the first chip 112 through the third conductive layer 110 and the conductive adhesion layer 113. Through the first bonding wire 200, the second conductive layer 104 and the conductive adhesion layer 113, the current may be provided from the first chip 112 to the second chip 114. Through the second bonding wire 202 and the first conductive layer 102, the current may be provided from the second chip 114 to the second terminal 206 and transmitted to the external apparatus through the second terminal 206. In addition, the current may also be transmitted to the external apparatus through the second conductive layer 104 and the third terminal 208. In this way, the vertical mutual inductance path may be provided to achieve the purpose of reducing inductance.

A simulation test is performed on the power module 20, in which the insulating metal substrate is stacked on the DBC ceramic substrate, and the general power module, in which one DBC ceramic substrate is stacked on another DBC ceramic substrate. In the simulation results, compared with the general power module with the inductance value of 2.99 nH, the power module 20 has a lower inductance value (2.01 nH). It can be seen from the above, the power module of the embodiment of the present disclosure may have a lower parasitic inductance.

Figure 3:
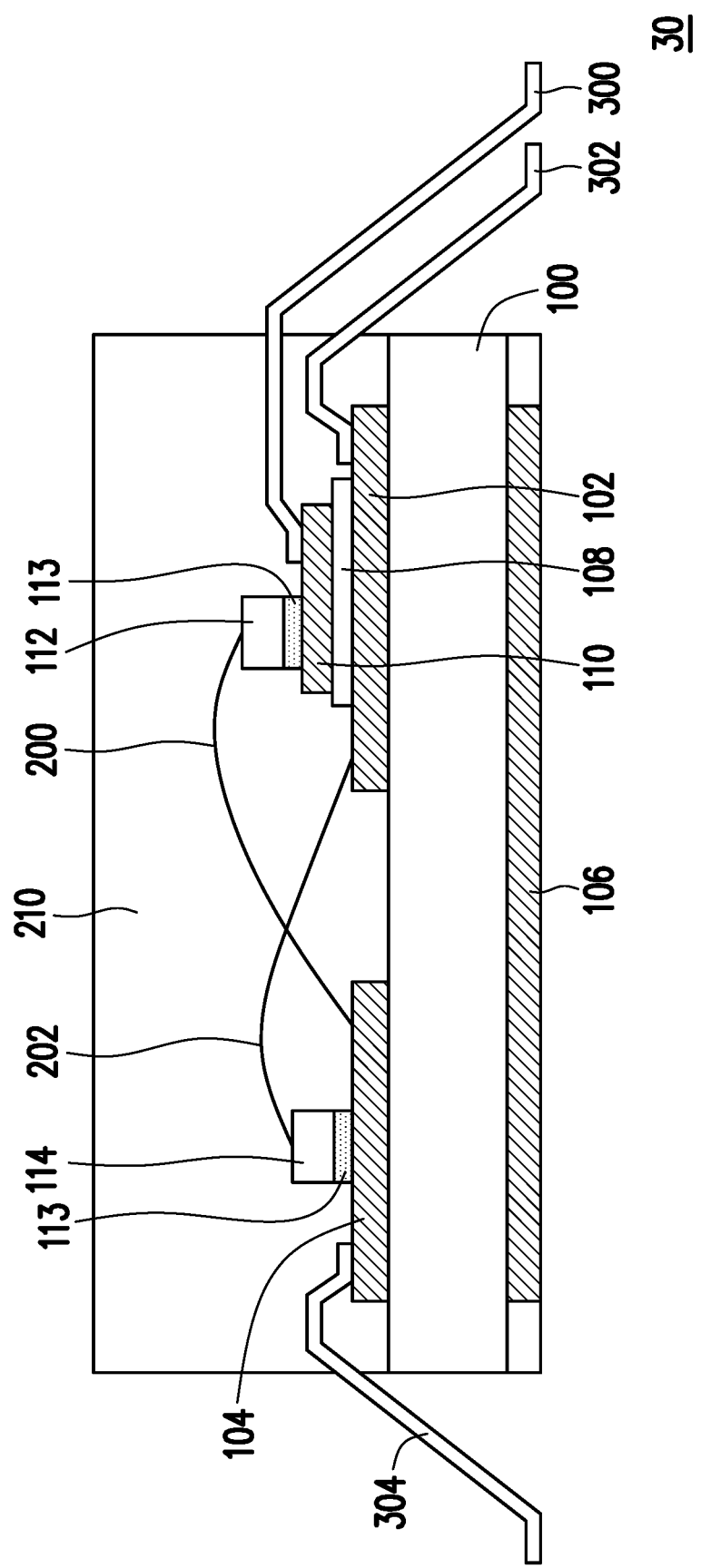
FIG. 3 is a schematic cross-sectional view of a power module according to a third embodiment of the present disclosure.

FIG. 3 is a schematic cross-sectional view of a power module according to a third embodiment of the present disclosure. In the present embodiment, the same device as the second embodiment will be represented by the same reference number, and will not be further described here. Referring to FIG. 3, the difference between the power module 30 and the power module 20 is that in the power module 30, the current may be provided to the power module 30 or transmitted from the power module 30 through a lead frame. In detail, in the power module 30, a first lead 300 of the lead frame (not shown) may be used as the first terminal to be connected to the third conductive layer 110, a second lead 302 of the lead frame may be used as the second terminal to be connected to the first conductive layer 102, and a third lead 304 of the lead frame may be used as the third terminal to be connected to the second conductive layer 104.

Figure 4:
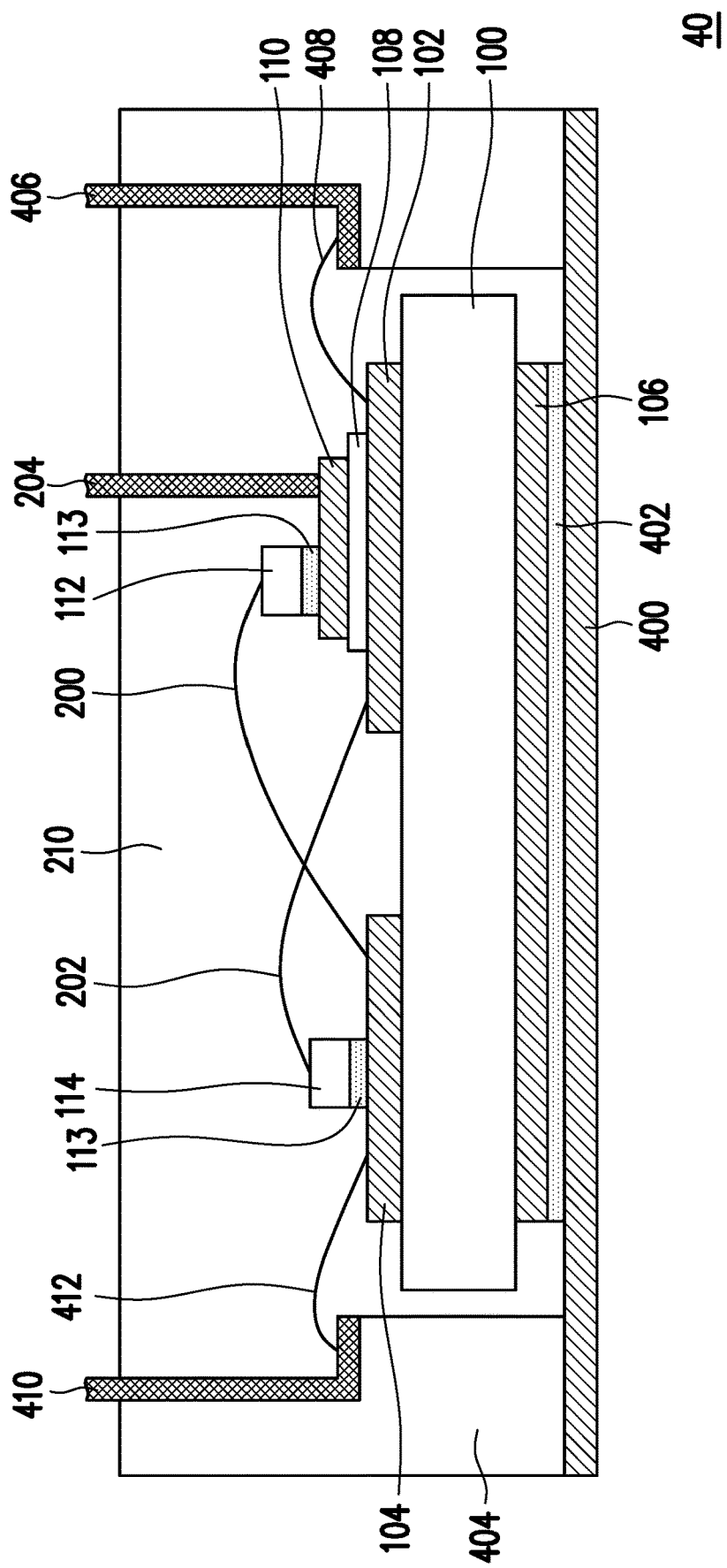
FIG. 4 is a schematic cross-sectional view of a power module according to a fourth embodiment of the present disclosure.

FIG. 4 is a schematic cross-sectional view of a power module according to a fourth embodiment of the present disclosure. In the present embodiment, the same device as the second embodiment will be represented by the same reference number, and will not be further described here. Referring to FIG. 4, in the power module 40, a thermal conductive carrier substrate 400 is disposed on the thermal conductive layer 106 and fixed to the thermal conductive layer 106 through a thermal conductive adhesion layer 402. In the present embodiment, the thermal conductive carrier substrate 400 is, for example, a metal substrate, and the thermal conductive adhesion layer 402 is, for example, a solder layer, but the embodiment of the present disclosure is not limited thereto. In addition, in the present embodiment, the size of the thermal conductive carrier substrate 400 is larger than that of the insulating substrate 100, and thus a housing 404 may be disposed in the edge region of the thermal conductive carrier substrate 400 to surround the insulating substrate 100 and the devices disposed thereon.

Furthermore, in the present embodiment, the first terminal 204 is connected to the third conductive layer 110, a second terminal 406 is disposed on the housing 404 and electrically connected to the first conductive layer 102 through a third bonding wire 408, and a third terminal 410 is disposed on the housing 404 and electrically connected to the second conductive layer 104 through a fourth bonding wire 412. The first terminal 204, the second terminal 406, and the third terminal 410 may be connected to the external apparatus, respectively. The encapsulant 210 is disposed inside the housing 404. In the present embodiment, the encapsulant 210 encapsulates the insulating substrate 100, the first conductive layer 102, the second conductive layer 104, the thermal conductive layer 106, the first thermal interface material layer 108, the third conductive layer 110, the first chip 112, the conductive adhesion layer 113, the second chip 114, the first bonding wire 200, the second bonding wire 202, a part of the first terminal 204, a part of the second terminal 406, a part of the third terminal 410, the third bonding wire 408, the fourth bonding wire 412 and the thermal conductive adhesion layer 402, but the embodiment of the present disclosure is not limited thereto.

In another embodiment, the first terminal 204 may be disposed on the housing 404 and electrically connected to the third conductive layer 110.

In each of the above embodiments, the first thermal interface material layer 108 and the third conductive layer 110 are disposed between the first chip 112 and the first conductive layer 102, the first chip 112 is fixed on the third conductive layer 110 through the conductive adhesion layer 113, and the second chip 114 is fixed on the second conductive layer 104 through the conductive adhesion layer 113. Therefore, the first chip 112 and the second chip 114 are located at different levels, but the embodiment of the present disclosure is not limited thereto. In other embodiments, the first chip 112 and the second chip 114 may be located at the same level.

Figure 5:
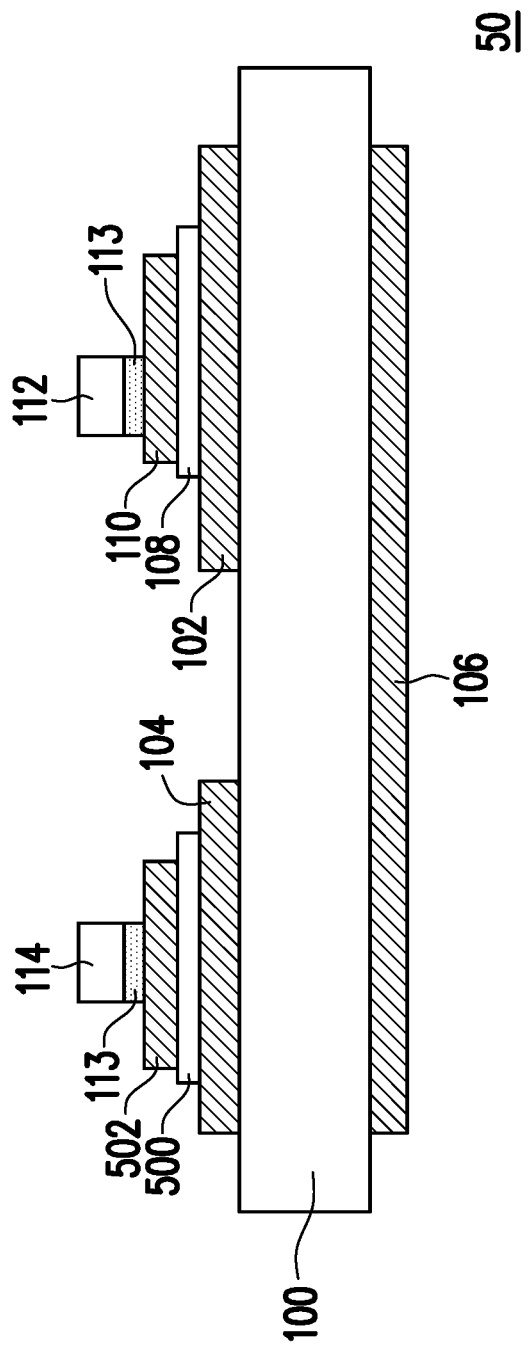
FIG. 5 is a schematic cross-sectional view of a power module according to a fifth embodiment of the present disclosure.

FIG. 5 is a schematic cross-sectional view of a power module according to a fifth embodiment of the present disclosure. In the present embodiment, the same device as the first embodiment will be represented by the same reference number, and will not be further described here. Referring to FIG. 5, the difference between the power module 50 and the power module 10 is that: in the power module 50, a second thermal interface material layer 500 and a fourth conductive layer 502 are disposed between the second chip 114 and the second conductive layer 104, and the second chip 114 is fixed on the fourth conductive layer 502 through the conductive adhesion layer 113. In the present embodiment, the material of the second thermal interface material layer 500 may be silicon, silicon oxide, aluminum oxide, aluminum nitride, boron nitride or a combination thereof. The thickness of the second thermal interface material layer 500 is, for example, between 100 μm and 150 μm. The thermal conductivity of the second thermal interface material layer 500 is, for example, between 3 W/mK and 15 W/mK, or even higher. The second thermal interface material layer 500 may be the same as or different from the first thermal interface material layer 108, which is not limited by the embodiment of the present disclosure. In addition, the fourth conductive layer 502 may be a metal layer, such as a copper layer, but the embodiment of the present disclosure is not limited thereto. In the present embodiment, the second thermal interface material layer 500 and the fourth conductive layer 502, and the first thermal interface material layer 108 and the third conductive layer 110 may be respectively formed on the first conductive layer 102 and the second conductive layer 104 in the same process step, but the embodiment of the present disclosure is not limited thereto.

In this way, in the power module 50, the first chip 112 and the second chip 114 may be located at the same level, which is beneficial to the layout design of the power module depending on the actual situation.

In summary, in the power module of the embodiment of the present disclosure, the insulating metal substrate composed of the thermal interface material layer and only one conductive layer is disposed on the DBC ceramic substrate composed of the insulating substrate and the conductive layers located on the upper and lower sides of the insulating substrate, and thus the overall thickness of the power module may be effectively reduced. In addition, since the overall thickness of the power module is reduced, under high power density, the difference in thermal resistance and heat capacity between different chips may be effectively reduced, and the mutual inductance in the power module may be more significant.

In addition, in the power module of the embodiment of the present disclosure, since the insulating metal substrate is disposed on the DBC ceramic substrate, the problem of excessive warp caused by stress relief during stacking ceramic substrates may be avoided.

Furthermore, in the manufacturing process of the power module of the embodiment, the insulating metal substrate is laminated to the DBC ceramic substrate before the chip is disposed, so that the chip may be prevented from being subjected to multiple reflow processes, thereby avoiding the reduction of the reliability of the chip.

Although the present disclosure has been disclosed above with embodiments, it is not intended to limit the present disclosure. Anyone with ordinary skilled in the art may make some changes and modifications without departing from the spirit and scope of the present disclosure. The scope of the present disclosure shall be determined by the scope of the following claims.

What is claimed is:

1. A power module, comprising:
an insulating substrate, having a first surface and a second surface opposite to each other;
a first conductive layer and a second conductive layer, disposed on the first surface and electrically separated from each other;
a first thermal interface material layer, disposed on the first conductive layer;
a third conductive layer, disposed on the first thermal interface material layer;
a first chip, disposed on the third conductive layer and electrically connected to the third conductive layer;
a conductive adhesion layer, disposed between the first chip and the third conductive layer;
a second chip, disposed on the second conductive layer and electrically connected to the second conductive layer; and
a thermal conductive layer, disposed on the second surface,
wherein the first thermal interface material layer and the third conductive layer constitute an insulating metal substrate, and the insulating metal substrate is insulated from an underlying layer by the first thermal interface material layer,
wherein the first thermal interface material layer is located between the first conductive layer and the third conductive layer, and is in contact with the first conductive layer and the third conductive layer, and
wherein an area of the first thermal interface material layer is less than an area of the first conductive layer, and less than an area of the insulating substrate.

2. The power module of claim 1, wherein the insulating substrate comprises a ceramic substrate or a thermal interface material substrate.

3. The power module of claim 1, wherein a material of the first thermal interface material layer comprises silicon, silicon oxide, aluminum oxide, aluminum nitride, boron nitride or a combination thereof.

4. The power module of claim 1, wherein a thickness of the first thermal interface material layer is between 100 μm and 150 μm.

5. The power module of claim 1, further comprising:
a first bonding wire, connecting the first chip and the second conductive layer;
a second bonding wire, connecting the second chip and the first conductive layer;
a first terminal, electrically connected to the third conductive layer;
a second terminal, electrically connected to the first conductive layer; and
a third terminal, electrically connected to the second conductive layer.

6. The power module of claim 5, wherein the first terminal comprises a first lead connected to the third conductive layer, the second terminal comprises a second lead connected to the first conductive layer, and the third terminal comprises a third lead connected to the second conductive layer.

7. The power module of claim 1, further comprising:
a second thermal interface material layer, disposed between the second chip and the second conductive layer; and
a fourth conductive layer, disposed between the second chip and the second thermal interface material layer.

8. The power module of claim 1, further comprising a thermal conductive carrier substrate disposed on the thermal conductive layer.

9. The power module of claim 1, further comprising an encapsulant encapsulating the first conductive layer, the second conductive layer, the first thermal interface material layer, the third conductive layer, the first chip and the second chip.

10. A manufacturing method of a power module, comprising:
providing an insulating substrate with a first surface and a second surface opposite to each other;
forming a first conductive layer and a second conductive layer on the first surface, wherein the first conductive layer and the second conductive layer are electrically separated from each other;
forming a thermal conductive layer on the second surface;
forming a first thermal interface material layer and a third conductive layer in sequence on the first conductive layer;
forming a conductive adhesion layer and a first chip in sequence on the third conductive layer, so that the first chip is electrically connected to the third conductive layer; and
forming a second chip on the second conductive layer, wherein the second chip is electrically connected to the second conductive layer, wherein the first thermal interface material layer and the third conductive layer constitute an insulating metal substrate, and the insulating metal substrate is insulated from an underlying layer by the first thermal interface material layer, wherein the first thermal interface material layer is located between the first conductive layer and the third conductive layer, and is in contact with the first conductive layer and the third conductive layer, and wherein an area of the first thermal interface material layer is less than an area of the first conductive layer, and less than the area of the insulating substrate.

11. The manufacturing method of a power module of claim 10, wherein a method for forming the first thermal interface material layer and the third conductive layer in sequence on the first conductive layer comprises:

laminating the third conductive layer on the first thermal interface material layer; and laminating the first thermal interface material layer onto the first conductive layer.

12. The manufacturing method of a power module of claim 10, wherein the insulating substrate comprises a ceramic substrate or a thermal interface material substrate.

13. The manufacturing method of a power module of claim 10, wherein a material of the first thermal interface material layer comprises silicon, silicon oxide, aluminum oxide, aluminum nitride, boron nitride or a combination thereof.

14. The manufacturing method of a power module of claim 10, wherein a thickness of the first thermal interface material layer is between 100 μm and 150 μm.

15. The manufacturing method of a power module of claim 10, further comprising:

forming a first bonding wire connecting the first chip and the second conductive layer;

forming a second bonding wire connecting the second chip and the first conductive layer;

forming a first terminal electrically connected to the third conductive layer;

forming a second terminal electrically connected to the first conductive layer; and forming a third terminal electrically connected to the second conductive layer.

16. The manufacturing method of a power module of claim 15, wherein the first terminal comprises a first lead connected to the third conductive layer, the second terminal comprises a second lead connected to the first conductive layer, and the third terminal comprises a third lead connected to the second conductive layer.

17. The manufacturing method of a power module of claim 10, further comprising forming a second thermal interface material layer and a fourth conductive layer in sequence on the second conductive layer before forming the second chip.

18. The manufacturing method of a power module of claim 17, wherein a method for forming the second thermal interface material layer and the fourth conductive layer in sequence on the second conductive layer comprises:

laminating the fourth conductive layer on the second thermal interface material layer; and laminating the second thermal interface material layer onto the second conductive layer.

19. The manufacturing method of a power module of claim 10, further comprises forming a thermal conductive carrier substrate on the thermal conductive layer.

20. The manufacturing method of a power module of claim 10, further comprising forming an encapsulant encapsulating the first conductive layer, the second conductive layer, the first thermal interface material layer, the third conductive layer, the first chip and the second chip after forming the thermal conductive layer.

* * * * *